United States Patent
Niebojewski et al.

(10) Patent No.: US 11,646,196 B2
(45) Date of Patent: May 9, 2023

(54) METHOD FOR GERMANIUM ENRICHMENT AROUND THE CHANNEL OF A TRANSISTOR

(71) Applicant: COMMISSARIAT A L'ENERGIE ATOMIQUE ET AUX ENERGIES ALTERNATIVES, Paris (FR)

(72) Inventors: Heimanu Niebojewski, Grenoble (FR); Christophe Plantier, Grenoble (FR); Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 93 days.

(21) Appl. No.: 17/445,747

(22) Filed: Aug. 24, 2021

(65) Prior Publication Data
US 2022/0068638 A1    Mar. 3, 2022

(30) Foreign Application Priority Data
Aug. 31, 2020  (FR) ...................................... 20 08832

(51) Int. Cl.
*H01L 21/02*   (2006.01)
*H01L 29/165*  (2006.01)
*H01L 29/66*   (2006.01)

(52) U.S. Cl.
CPC .. *H01L 21/02236* (2013.01); *H01L 21/02532* (2013.01); *H01L 29/165* (2013.01); *H01L 29/66553* (2013.01)

(58) Field of Classification Search
None
See application file for complete search history.

(56) References Cited

U.S. PATENT DOCUMENTS

| | | |
|---|---|---|
| 2008/0042209 A1 | 2/2008 | Tan et al. |
| 2011/0024804 A1 | 2/2011 | Chang et al. |
| 2013/0069123 A1 | 3/2013 | Illgen et al. |
| 2013/0175606 A1 | 7/2013 | Cheng et al. |
| 2020/0111870 A1 | 4/2020 | Aydin et al. |
| 2022/0068638 A1* | 3/2022 | Niebojewski ..... H01L 29/66772 |

OTHER PUBLICATIONS

French Preliminary Search Report dated May 14, 2021 in French Application 20 08832 filed on Aug. 31, 2020, 2 pages (with English Translation of Categories of Cited Documents).

(Continued)

*Primary Examiner* — Jack S Chen
(74) *Attorney, Agent, or Firm* — Oblon, McClelland, Maier & Neustadt, L.L.P.

(57) ABSTRACT

Making of a transistor structure comprising in this order:
forming semiconductor blocks made of $Si_xGe_{1-x}$ over the surface semiconductor layer and on either side of insulating spacers, the semiconductor blocks having lateral facets,
growth of a silicon-based layer over the semiconductor blocks, so as to fill cavities located between said facets and said insulating spacers,
thermal oxidation to perform a germanium enrichment of semiconductor portions of the surface semiconductor layer disposed on either side of the spacers.

8 Claims, 2 Drawing Sheets

(56) References Cited

OTHER PUBLICATIONS

Rozé et al., "SiGe Oxidation Kinetics and Oxide Density Measured by Resonant Soft X-Ray Reflectivity", Proceedings of the 2017 IEEE Nanotechnology Material and Devices Conference, 2017, 2 pages.
Tezuka et al., "A Novel Fabrication Technique of Ultrathin and Relaxed SiGe Buffer Layers with High Ge Fraction for Sub-100nm Strained Silicon-on-Insulator MOSFETs", Japanese Journal of Applied Physics, vol. 40, Part 1, No. 4B, Apr. 2001, 10 pages.
Tezuka et al., "Selectively-formed high mobility SiGe-on-Insulator pMOSFETs with Ge-rich strained surface channels using local condensation technique", 2004 Symposium on VLSI Technology Digest of Technical Papers, 2004, 2 pages.

\* cited by examiner

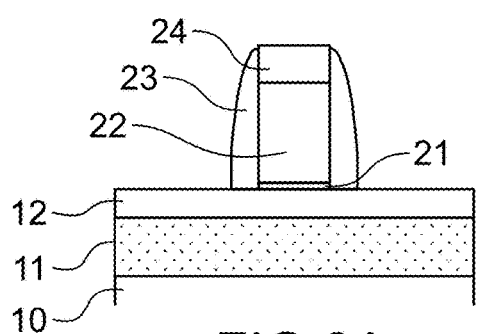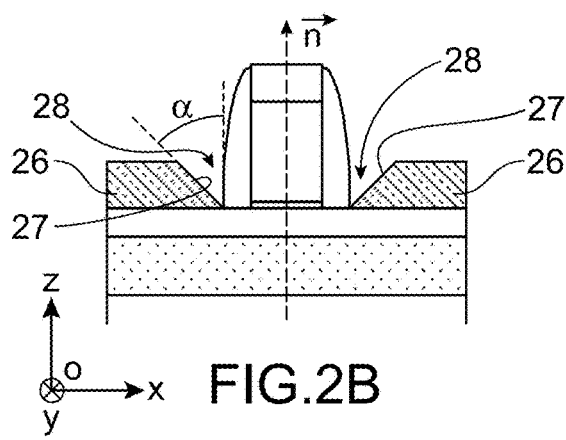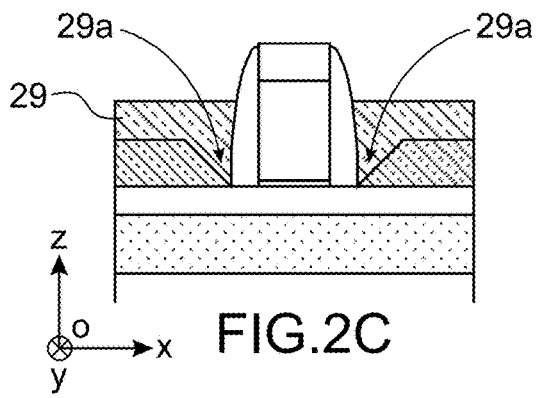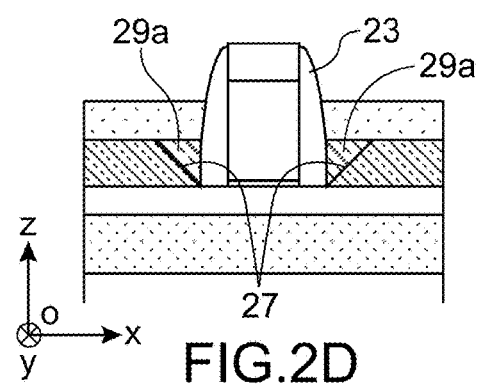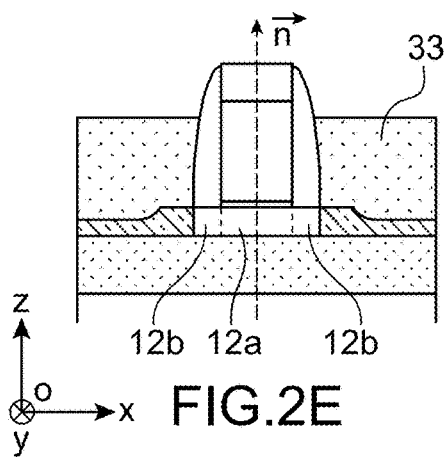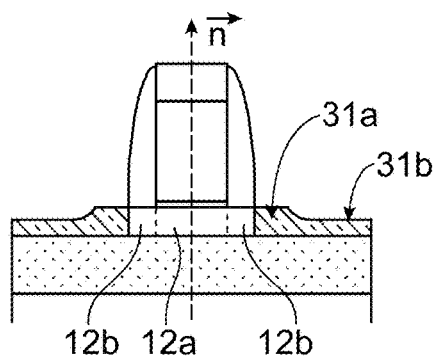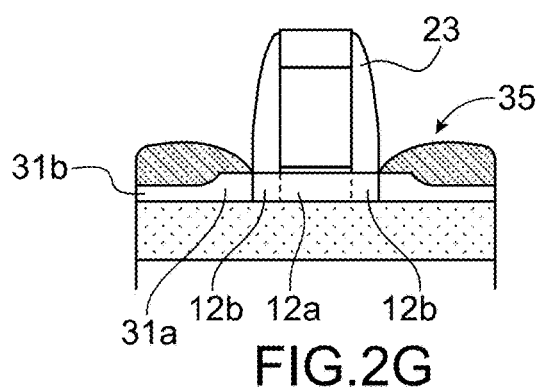

METHOD FOR GERMANIUM ENRICHMENT AROUND THE CHANNEL OF A TRANSISTOR

TECHNICAL FIELD AND STATE OF THE ART

The present invention relates to the field of transistor structures, and more particularly those provided with a channel area undergoing a mechanical deformation or stress.

By mechanical deformation, it should be understood a material whose crystalline lattice parameter(s) are extended or shortened.

In the case where the deformed lattice parameter is greater than the so-called "natural" parameter of a crystalline material, the latter is said in tensile deformation. When the deformed lattice parameter is smaller than the natural lattice parameter, the material is said in compressive deformation or in compression.

Mechanical stress states are associated to these mechanical deformation states. Nevertheless, it is also common to refer to these deformation states as mechanical stress states. In the rest of the present application, this strain notion will be referred to in a generic way by the term "stress".

A stress applied to a semiconductor material induces a modification of the crystalline lattice and therefore of its band structure, resulting in a modification of the mobility of the carriers in this material.

The mobility of the electrons is increased (respectively reduced) by the application of a longitudinal tensile (respectively compressive) stress to the semiconductor material within which they transit while the mobility of the holes will be increased (respectively reduced) when the semiconductor is compressed (respectively tensioned) in the longitudinal direction.

To improve the performances of P-type transistors, it is known to provide for a channel structure formed in a surface layer subjected to a compressive stress of a semiconductor-on-insulator type substrate.

This, the document US 2008/0042209 A1 discloses a method for making a transistor over a SOI substrate 1 having a channel structure formed in a surface silicon layer which is stressed. This stress application is carried out by a SiGe growth over the surface layer and then by performing a Germanium enrichment of regions of the surface layer on either side of the channel region. Upon completion of this Germanium enrichment, pinch areas 6 where the semiconductor material thickness is reduced may tend to form on either side of a region 3 of the surface layer located opposite the gate and the spacers 5. Such pinch areas 6 between this region 3 and Germanium-enriched portions 4 are illustrated in FIG. 1 and give rise to several problems.

First of all, they could limit, and even prevent, the transmission of stress towards the channel region.

They could also disturb the subsequent formation of source and drain blocks by being at the origin of unwetting of a semiconductor thickness that is formed afterwards typically by epitaxy to form these blocks.

Finally, they could create an electrical discontinuity of source and drain blocks towards the channel or at least increase resistances against access to the channel.

There arises the problem of finding a new method for making a stressed transistor structure that is improved with regards to the aforementioned drawbacks.

DISCLOSURE OF THE INVENTION

An embodiment of the present invention provides for a method for making a transistor structure comprising, in this order:

providing a gate block and insulating spacers on either side of the gate block over a determined region of a surface semiconductor layer of a semiconductor-on-insulator type substrate, the surface semiconductor layer being based on a first semiconductor material, in particular Si or $Si_{1-a}Ge_a$ with a $>0$, the determined region being adapted to accommodate a channel structure of said transistor opposite said gate block, forming semiconductor blocks over the surface semiconductor layer and on either side of the spacers by growth of a second semiconductor material based on $Si_xGe_{1-x}$ with $x>0$, the semiconductor blocks having lateral facets forming a non-zero angle with a normal to the surface semiconductor layer, the lateral facets defining cavities between the facets and the insulating spacers, deposition, in particular by growing, of a silicon layer over the semiconductor blocks, so as to fill the cavities located between the facets and the insulating spacers, thermal oxidation of said semiconductor blocks and of the silicon layer, so as to carry out a germanium enrichment of a portion of the surface semiconductor layer, this portion being disposed around the channel and the spacers.

By the presence of the silicon layer and by its arrangement with respect to the semiconductor blocks based on $Si_xGe_{1-x}$, upon completion of the thermal oxidation, a germanium enrichment of said portions is obtained without any undesired pinching phenomenon and even without the thickness of these portions being reduced in comparison with the regions for access to the channel. Thus, this allows limiting access resistances, applying a better stress to the channel structure and promoting a subsequent resumption of epitaxy when forming the source and drain blocks.

Advantageously, the deposition of the silicon layers over the semiconductor blocks is carried out so as to completely fill said cavities.

Advantageously, the growth of the second semiconductor material based on $Si_xGe_{1-x}$ is carried out without doping. Thus, the semiconductor blocks are not doped when said thermal oxidation is performed.

Advantageously, the growth of the silicon-based layer over the semiconductor blocks, is carried out without doping. Thus, the silicon-based layer is not doped when the thermal oxidation is performed.

The second semiconductor material may be different from the first semiconductor material and have a lattice parameter different from that of the first semiconductor material.

According to a particular implementation of the method for which the thermal oxidation leads to the formation of an oxide layer over said semiconductor blocks, the method may further comprise steps of:

removal of the oxide layer, semiconductor material growth over semiconductor portions of the surface semiconductor layer disposed on either side of the spacers. Thus, source and drain blocks may be formed from the base blocks of the second semiconductor material. Advantageously, a doping is performed in situ during said semiconductor material growth over the semiconductor portions of the surface semiconductor layer.

According to a particular embodiment, after the thermal oxidation, at least one heat annealing in a neutral atmosphere is performed, so as to homogenise the Germanium concentration of the semiconductor portions.

Typically, the formed transistor is a P-type transistor. The Germanium-enriched semiconductor portions then allow exerting a compressive stress over the determined region in which the channel structure is provided.

BRIEF DESCRIPTION OF THE DRAWINGS

The present invention will be better understood based on the following description and on the appended drawings wherein:

FIGS. 2A, 2B, 2C, 2D, 2E, 2F, 2G illustrate an example of a method according to an embodiment of the invention for the manufacture of Germanium-enriched regions on either side of a region intended to form a transistor channel structure.

Identical, similar or equivalent portions of the different figures bear the same reference numerals in order to facilitate switching from one figure to another.

Figure 1:
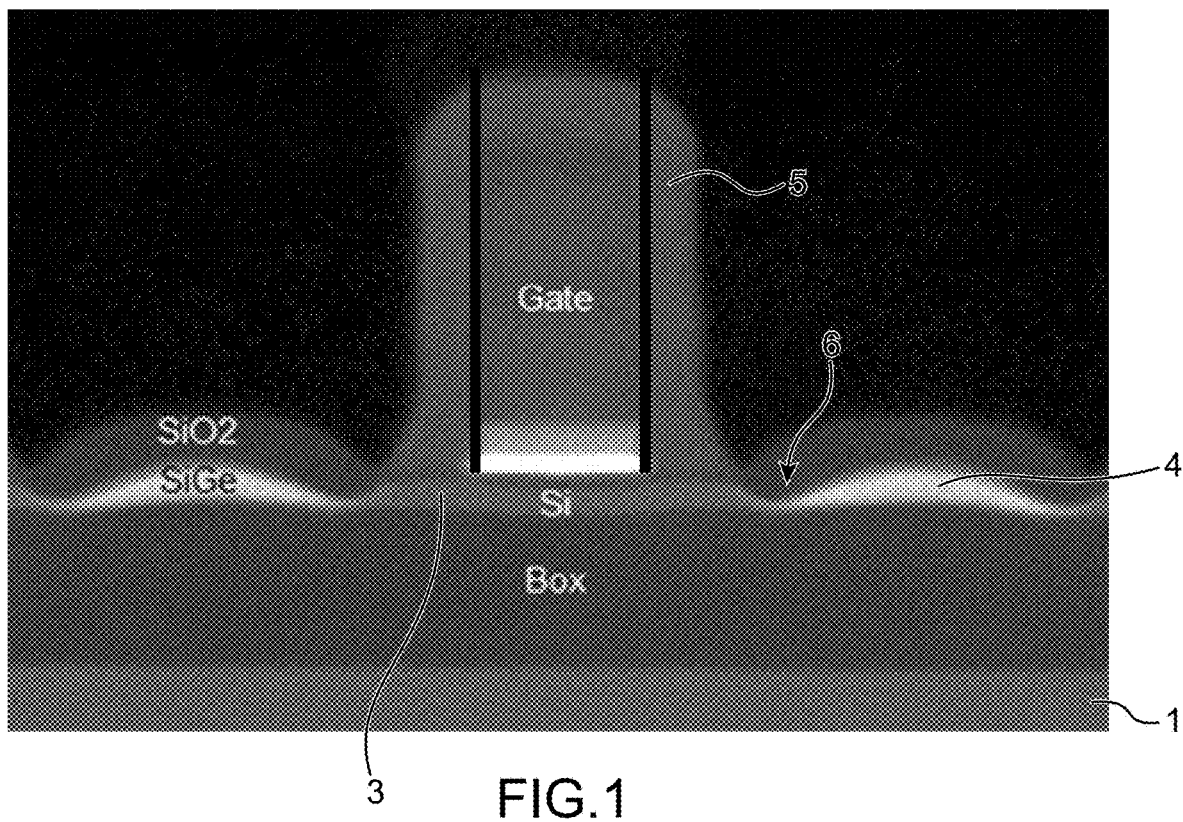
FIG. 1 illustrates a phenomenon of undesired pinching of semiconductor regions proximate to the spacers following the implementation of a germanium enrichment process as implemented according to the prior art.

To make the figures more readable, the different portions represented in the figures are not necessarily according to a uniform scale.

Furthermore, in the following description, terms that depend on the orientation of a structure such as "front", "upper", "rear", "lower", "lateral", should apply while considering that the structure is oriented as illustrated in the figures.

DETAILED DISCLOSURE OF PARTICULAR EMBODIMENTS

A possible starting structure, for implementing a method according to an embodiment of the present invention, is shown in FIG. 2A.

This structure comprises a semiconductor-on-insulator type substrate, with a semiconductor support layer 10, made typically of silicon, an insulating layer 11 of silicon oxide arranged over the support layer 10 and a surface semiconductor layer 12 disposed over and in contact with the insulating layer 11 and intended to accommodate at least one channel region of a transistor, in particular a P-type transistor, for example a PMOS.

The surface semiconductor layer 12 is based on a first semiconductor material, typically silicon, the substrate may then be of the SOI ("Silicon On Insulator") type. In this case, orientation silicon <110> is preferably used for the surface semiconductor layer 12. Alternatively, it is possible to provide the surface semiconductor layer 12 made of $Si_{1-a}Ge_a$ with a comprised for example between 0.05 and 0.80 and typically between 0.2 and 0.5, preferably between 0.2 and 0.3.

Advantageously, the substrate may be intended to accommodate transistors of the fully depleted technology, in particular FDSOI (standing for "Fully Depleted Silicon on Insulator"). Thus, the surface semiconductor layer 12 may be provided with a thickness comprised for example between 2 nm and 20 nm, advantageously between 2 nm and 16 nm and typically in the range of 8 nm.

In the illustrated example, a gate dielectric 21, a gate block 22 of the transistor 12, and spacers 23 on either side of the gate block 22 are already formed. The gate block 22 may be intended herein to form the final gate electrode of the transistor.

For example, the gate block 22 may be based on polysilicon or TiN or W or a combination of these materials. For example, the spacers 23 may be based on SiN or SiCo or SiBCN or SiOCN or a combination of these materials. In the illustrated particular embodiment, the gate block 22 is also surmounted by at least one hard mask 24 for example formed by a SiN and/or $SiO_2$ layer.

Alternatively, it is possible to use a sacrificial or dummy gate block intended to be subsequently removed and replaced with a final gate.

Afterwards, a second semiconductor material, containing Germanium, is grown by epitaxy over the first semiconductor material of said surface semiconductor layer 12, and which is intended to carry out a Germanium enrichment of the surface layer 12.

The second semiconductor material may be different from the first semiconductor material and have a lattice parameter different from that of the first semiconductor material. The second semiconductor material may be based on $Si_{1-x}Ge_x$ with x>0. For example, the Germanium concentration x is comprised between 0.05 and 0.80 and typically between 0.2 and 0.5, preferably such that x>a when the first semiconductor material is $Si_{1-a}Ge_a$.

As shown in FIG. 2B, the growth of the second semiconductor material over the first semiconductor material is typically carried out so as to form blocks 26 of the second semiconductor material having lateral facets 27 forming a non-zero angle α with a normal n to a main plane of the surface layer (i.e. a plane passing through the surface layer and parallel to the plane [O; x; y] of the orthogonal reference frame [O; x; y; z] shown in FIG. 2B). Preferably, the epitaxial growth of this second material is performed without doping in situ so that the blocks 26 are not doped at this step of the method.

A cleaning prior to the epitaxy may be performed to optimise the surface over which the growth is carried out. For example, such a cleaning is performed using a process of the type called "HFlast" including a Si surface preparation sequence wherein an etching of a native oxide using HF is performed at the end of the sequence, that being so in order to leave the surface of the hydrogen bonds. Another example of a surface preparation method involves a SiConi™ type process. Such a process uses a plasma-assisted dry etching. The faceted SiGe epitaxy to form the blocks 26 may be performed using $GeH_4$+HCl type precursors at a temperature, for example in the range of 650° C. For example, the gross thickness may be comprised between 4 nm and 10 nm.

The blocks 26 are formed by selective epitaxy without covering the spacers 23 or the gate 22.

The lateral facets 27 have an end located at the root of the spacers 23. By the arrangement of the facets 27 with respect to the spacers 23, spaces or cavities 28 are arranged between the spacers 23 and the facets 27 of the blocks 26 of the second semiconductor material.

As illustrated in FIG. 2C, these cavities 28 are then filled, at least partially, using a semiconductor layer 29. The semiconductor layer 29 is formed by deposition, in particular by epitaxial growth, over the blocks 26. The layer 29 is based on a material different from that of the semiconductor blocks 26 and in particular with a germanium concentration lower than that of the semiconductor blocks 26. Preferably, the semiconductor material of the layer 29 is selected so as to be able to grow without forming facets. Thus, the semiconductor material of the layer 29 may consist of silicon. The formation of this layer 29 may be such that some portions could extend over upper faces of the blocks 26. The growth of this material may possibly be carried out so that portions 29a of the layer 29 completely fill the cavities 28 (FIG. 2C).

The semiconductor layer 29 is selectively formed without covering the gate 22. This epitaxial growth of the semiconductor layer 29 is preferably performed without doping in situ.

Afterwards, a Germanium enrichment of the surface semiconductor layer 12 is carried out with Germanium from the blocks 26. For example, such an enrichment may be performed using an oxidation process as described in the document: "A novel fabrication technique of ultrathin and relaxed SiGe buffer layers with high Ge fraction for sub-100 nm strained silicon on insulator MOSFETs, Tezuka et al., *Japanese Journal of Applied Physics*, vol. 40, p 2866-2874, 2001" or in the document "Selectively formed high mobility SiGe on Insulator pMOSFETs with Ge-rich strained surface channels using local condensation technique, Tezuka et al., *Symposium on VLSI Technology*, 2004". To perform the Ge condensation, at least one first thermal oxidation step is carried out at a temperature that is preferably high yet below the melting point of the material $Si_{1-x}Ge_x$, typically at a temperature comprised between 750° C. and 1100° C. The oxidation duration/temperature pair depends on the thickness of the layer to be oxidised. For example, it is possible to provide for carrying out the oxidation at a temperature of 900° C. over a time period in the range of 5 min, or at a temperature of 1050° C. over a time period in the range of 20 s, for a layer with a thickness in the range of 6 nm of SiGe with a Germanium concentration in the range of 30%.

During the oxidation step, the silicon of the layer 29 tends to be consumed, so as to form $SiO_2$. A horizontal oxidation front, in other words parallel to the plane [O; x; y] shown in FIG. 2D propagates and reaches the upper face of the blocks 26.

In FIG. 2D (illustrating the structure during oxidation), the oxidation of the entire thickness of portions of the layer 29 located over the upper faces of blocks 26 whereas other portions 29a of the layer 29 that fill the cavities 28 and separate the lateral facets 27 of the spacers 23 are not oxidised yet. Afterwards, the semiconductor blocks 26 and the portions 29a have different oxidation rates because of their different respective silicon proportions, as described in the document: "Si et SiGe: SiGe oxidation kinetics and oxide density measured by resonant soft X-ray reflectivity", Roze et al., Nanotechnology Material and Devices Conference 2017. The oxidation is carried on over the entire thickness of the blocks 26 and then preferably so as to oxidise the portions 29a.

By the absence of doping of the blocks 26 and of the semiconductor layer 29, there is no inappropriate diffusion of dopants during the thermal oxidation.

By the arrangement of the blocks 26 and of the semiconductor layer 29, the Germanium concentration is enhanced in the portions 12a of the surface layer 12 that are further away than those directly contiguous to the access regions 12b (FIG. 2E). Since the oxidation rate depends on the Germanium concentration, with such an arrangement, a pinching effect as mentioned before and illustrated in FIG. 1, which could cause a discontinuity of the surface semiconductor layer 12 and in any case increase resistances against access to the channel, is avoided.

Typically, the portions 31a with a lower Germanium content even have a larger thickness than that of portions 31b further away from the channel structure and could be formed with a thickness at least equal to, and even larger than, that of the access regions 12b and of the channel structure 12a.

Such a convex shape of the regions 12b has the advantage of promoting stressing of the channel structure when an epitaxy is carried out afterwards over these regions 12b in order to complete the formation of the source and drain blocks. Such a shape of the regions 12b also allows achieving a better doping profile of the source and drain blocks.

Nonetheless, because of the Germanium enrichment, the semiconductor region 12a-12b located opposite the gate 22 and the spacers 23, and consequently the channel structure 12a of the transistor, is stressed.

Optionally, it is possible to carry out an additional heat treatment step afterwards, this time preferably in a neutral atmosphere, in order to homogenise the Germanium concentration of silicon germanium semiconductor portions formed on either side of the spacers and of the regions 12b for access to the channel 12a. Such an annealing may be performed at a temperature comprised between 800° C. and 1000° C. according to a duration comprised for example between 2 min and 2 h for example an annealing at a temperature in the range of 900° C. over a time period in the range of 2 hours may be performed.

Afterwards, a deoxidation for removing an oxide thickness 33 formed during the condensation in Germanium may be performed (FIG. 2F). It is possible to perform this removal for example using diluted HF, for example with a concentration of 1%.

Afterwards, it is possible to carry on the fabrication of the transistor and in particular complete the formation of source and drain blocks.

For this purpose, it is possible to make semiconductor regions 35 grow by epitaxy on either side of the spacers 23 from the semiconductor portions 31a, 31b (FIG. 2G). Preferably, a semiconductor material that could promote a compressive stress in the channel structure is selected. Typically, the semiconductor regions 35 are made of Silicon Germanium, preferably doped, for example with Boron. A doping in situ performed during the growth of the semiconductor material may be performed. For example, a dose in the range of 1*20 at*cm$^{-3}$ may be used for example.

Afterwards, it is also possible to form contacts over the source, drain regions and possibly over the gate by formation of compound and metal areas over these regions in order to complete the manufacture of the transistor.

Afterwards, other conventional manufacturing steps of forming an insulating encapsulation and of manufacturing contact pads may be carried out.

A P-type transistor formed in the Germanium-enriched surface semiconductor layer of a semiconductor-on-insulator type substrate is particularly suited for the implementation of Low-Power and High-Performance circuits.

The invention claimed is:

1. A method for making a transistor structure comprising, in this order, the following steps of:
   providing a gate block and insulating spacers on either side of the gate block over a determined region of a surface semiconductor layer of a semiconductor-on-insulator type substrate, the surface semiconductor layer being based on a first semiconductor material, in particular Si or $Si_{1-a}Ge_a$ with a>0, the determined being adapted to accommodate a channel structure of said transistor opposite said gate block,
   forming semiconductor blocks over said surface semiconductor layer and on either side of the spacers by growth of a second semiconductor material based on $Si_xGe_{1-x}$ with x>0, the semiconductor blocks having lateral facets forming a non-zero angle with a normal to the surface semiconductor layer, the lateral facets defining cavities between said facets and said insulating spacers, deposition of a silicon layer over the semiconductor blocks, so as to fill the cavities located between said facets and said insulating spacers, the deposition of the silicon layer over the semiconductor blocks being carried out so as to completely fill said cavities, thermal oxidation of said semiconductor blocks and of said silicon layer, so as to carry out a germanium enrichment of a portion of the surface semiconductor layer, said portion being disposed around the channel and the spacers.

2. The method according to claim 1, wherein the growth of said second semiconductor material based on $Si_xGe_{1-x}$ is carried out without doping, said semiconductor blocks not being doped when said thermal oxidation is performed.

3. The method according to claim 1, wherein the deposition of said silicon layer over the semiconductor blocks, is carried out without doping, said silicon layer not being doped when said thermal oxidation is performed.

4. The method according to claim 1, wherein said thermal oxidation leads to the formation of an oxide layer over said semiconductor blocks, the method further comprising steps of:

removal of said oxide layer, semiconductor material growth over semiconductor portions of the surface semiconductor layer disposed on either side of the spacers.

5. The method according to claim 4, wherein a doping is performed in situ during said semiconductor material growth over said semiconductor portions of the surface semiconductor layer.

6. The method according to claim 4, wherein after said thermal oxidation, at least one heat annealing in a neutral atmosphere is performed, so as to homogenise the Germanium concentration of said semiconductor portions of the surface semiconductor layer.

7. The method according to claim 1, the second semiconductor material having a lattice parameter different from that of the first semiconductor material.

8. The method according to claim 4, wherein the transistor is of the P type, said semiconductor portions formed by Germanium enrichment exerting a compressive stress on said determined region.

* * * * *